(12) United States Patent
Kousai et al.

(10) Patent No.: US 9,007,139 B2
(45) Date of Patent: Apr. 14, 2015

(54) OSCILLATION FREQUENCY ADJUSTING CIRCUIT

(71) Applicant: Kabushiki Kaisha Toshiba, Minato-ku, Tokyo (JP)

(72) Inventors: Shouhei Kousai, Kanagawa (JP); Yuji Satoh, Chiba (JP); Hiroyuki Kobayashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 83 days.

(21) Appl. No.: 13/789,558

(22) Filed: Mar. 7, 2013

(65) Prior Publication Data

US 2013/0335148 A1    Dec. 19, 2013

(30) Foreign Application Priority Data

Jun. 13, 2012  (JP) ................................. 2012-133750
Jan. 8, 2013  (JP) ................................. 2013-001235

(51) Int. Cl.
*H03L 1/00* (2006.01)
*H03L 7/00* (2006.01)
*H03L 1/04* (2006.01)
*H03L 7/22* (2006.01)
*H03L 1/02* (2006.01)

(52) U.S. Cl.
CPC . *H03L 7/00* (2013.01); *H03L 1/026* (2013.01); *H03L 1/022* (2013.01); *H03L 1/027* (2013.01); *H03L 1/04* (2013.01); *H03L 7/22* (2013.01); *H03L 2207/50* (2013.01)

(58) Field of Classification Search
CPC ............ H03B 5/04; H03L 1/028; H03L 1/00; H03L 1/022; H03L 1/026
USPC ............................ 331/16, 34, 158, 57, 176, 2
See application file for complete search history.

(56) References Cited

U.S. PATENT DOCUMENTS

| 8,729,978 B2 * | 5/2014 | Akaike et al. ................. 331/176 |
| 2011/0181367 A1 | 7/2011 | Satoh et al. |
| 2012/0056682 A1 | 3/2012 | Satoh et al. |
| 2013/0033332 A1 * | 2/2013 | Akaike et al. ................... 331/70 |

FOREIGN PATENT DOCUMENTS

| JP | 2006-019987 A | 1/2006 |
| JP | 2006-020000 A | 1/2006 |
| JP | 2006-050025 A | 2/2006 |
| JP | 2011-155489 A | 8/2011 |

* cited by examiner

*Primary Examiner* — Arnold Kinkead
(74) *Attorney, Agent, or Firm* — Holtz, Holtz, Goodman & Chick PC

(57) ABSTRACT

According to one embodiment, a first oscillator has an oscillation frequency that is changed depending on a temperature. A second oscillator has different temperature characteristics from the first oscillator. An on-chip heater heats the first oscillator and the second oscillator. A counter counts a first oscillation signal of the first oscillator. An ADPLL generates a third oscillation signal on the basis of a second oscillation signal of the second oscillator and corrects the frequency of the third oscillation signal on the basis of a count value of the counter.

20 Claims, 8 Drawing Sheets

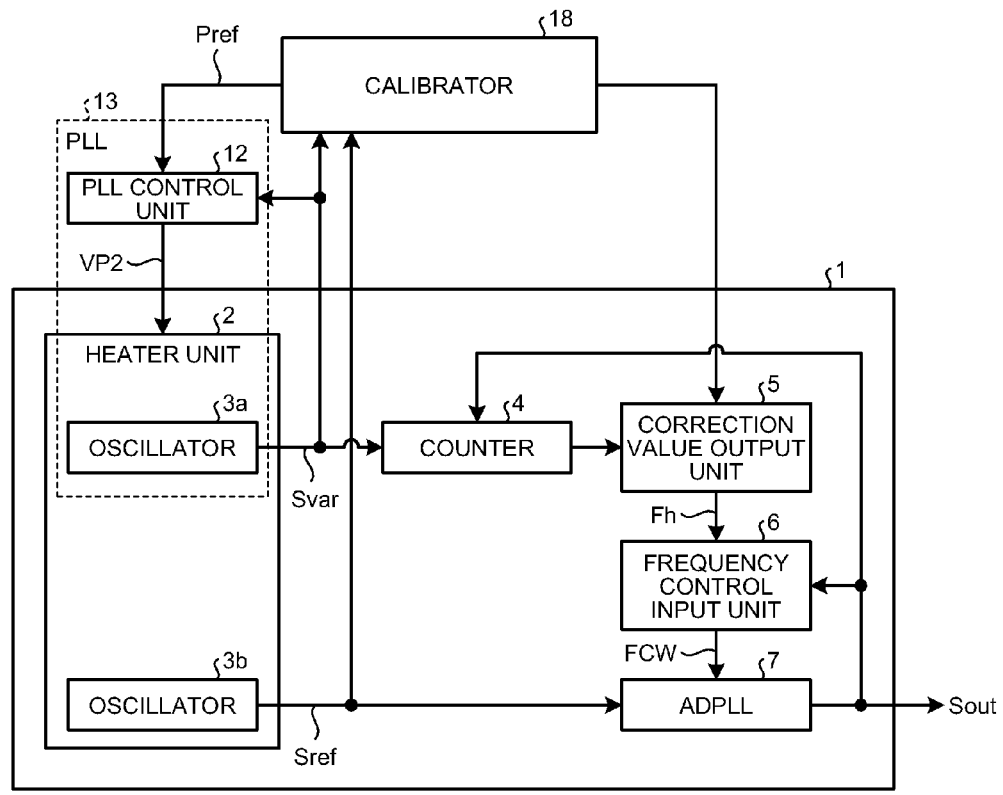
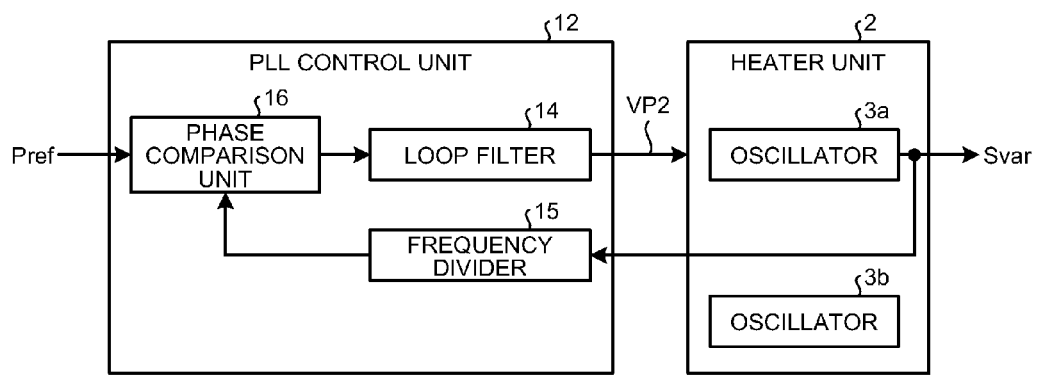

OSCILLATION FREQUENCY ADJUSTING CIRCUIT

CROSS-REFERENCE TO RELATED APPLICATIONS

This application is based upon and claims the benefit of priority from Japanese Patent Application No. 2012-133750, filed on Jun. 13, 2012 and Japanese Patent Application No. 2013-1235, filed on Jan. 8, 2013; the entire contents of all of which are incorporated herein by reference.

FIELD

Embodiments described herein relate generally to oscillation frequency adjusting circuits.

BACKGROUND

For example, in a semiconductor integrated circuit, an oscillator has been widely used as a signal source which sets a reference frequency. However, the oscillation frequency of the oscillator varies depending on the temperature. Therefore, the oscillation frequency of the oscillator is corrected according to a temperature variation. The temperature characteristics of the oscillator are measured in order to correct the oscillation frequency of the oscillator. At that time, when the entire IC chip having the oscillator incorporated thereinto is heated, it takes a long time for the temperature to be stabilized. As a result, it takes a long time to measure the temperature characteristics.

BRIEF DESCRIPTION OF THE DRAWINGS

FIG. 8 is a block diagram illustrating the schematic structure of an oscillation frequency adjusting circuit according to a second embodiment;

FIG. 9 is a block diagram illustrating the schematic structure of a PLL control unit illustrated in FIG. 8;

DETAILED DESCRIPTION

In general, according to one embodiment, an oscillation frequency adjusting circuit includes a first oscillator, a second oscillator, an on-chip heater, a counter, and an ADPLL. The first oscillator has an oscillation frequency that is changed depending on a temperature. The second oscillator has different temperature characteristics from the first oscillator. The on-chip heater heats the first oscillator and the second oscillator. The counter counts a first oscillation signal of the first oscillator. An ADPLL generates a third oscillation signal on the basis of a second oscillation signal of the second oscillator and corrects a frequency of the third oscillation signal on the basis of a count value of the counter.

Hereinafter, oscillation frequency adjusting circuits according to embodiments will be described in detail with reference to the accompanying drawings. The invention is not limited by the embodiments.

(First Embodiment)

Figure 1:
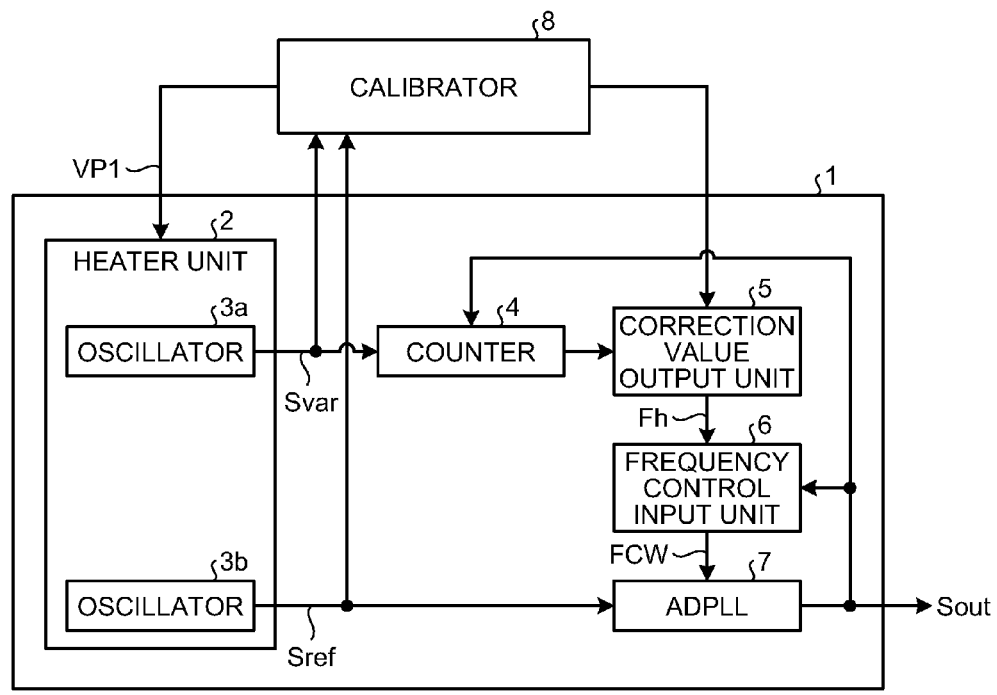
FIG. 1 is a block diagram illustrating the schematic structure of an oscillation frequency adjusting circuit according to a first embodiment.

FIG. 1 is a block diagram illustrating the schematic structure of an oscillation frequency adjusting circuit according to a first embodiment.

In FIG. 1, the oscillation frequency adjusting circuit includes a heater unit 2, oscillators 3a and 3b, a counter 4, a correction value output unit 5, a frequency control input unit 6, and an ADPLL (All Digital PLL) 7. The heater unit 2, the oscillators 3a and 3b, the counter 4, the correction value output unit 5, the frequency control input unit 6, and the ADPLL 7 may be formed in a semiconductor chip 1.

The oscillator 3a outputs an oscillation signal Svar. An oscillation frequency Fvar of the oscillator 3a may be changed depending on the temperature. For example, the oscillator 3a may be configured such that the oscillation frequency Fvar is monotonously changed depending on the temperature. The oscillator 3b outputs an oscillation signal Sref. The oscillation frequency Fref of the oscillator 3b may be changed depending on the temperature. For example, the oscillator 3b may be configured such that a change in the oscillation frequency Fref depending on the temperature is less than that in the oscillator 3a or the oscillation frequency Fref is not changed depending on the temperature.

The heater unit 2 can heat the oscillators 3a and 3b at the same time. The heater unit 2 and the oscillators 3a and 3b may be arranged such that the temperatures of the oscillators 3a and 3b are equal to each other during heating.

The counter 4 counts the oscillation signal Svar. For example, the counter 4 can increase the count value whenever the rising edge of the oscillation signal Svar is detected.

The correction value output unit 5 outputs a correction value Fh for correcting the temperature characteristics of the oscillator 3b on the basis of the count value of the counter 4. The correction value Fh may be used to correct the second or higher-order temperature characteristics of the oscillator 3b. In addition, the correction value output unit 5 may be a lookup table in which the correspondence between the count value of the counter 4 and the correction value Fh is registered or an arithmetic unit which calculates the correction value Fh on the basis of a polynomial which describes the second or higher-order temperature characteristics of the oscillator 3b.

The frequency control input unit 6 generates a frequency control input FCW (Frequency Command Word) of the ADPLL 7 on the basis of the correction value Fh. The frequency control input FCW may be the ratio of the oscillation frequency Fout of the oscillation signal Sout of the ADPLL 7 and the correction value Fh.

The ADPLL 7 generates the oscillation signal Sout on the basis of the oscillation signal Sref of the oscillator 3b and corrects the oscillation frequency Fout of the oscillation signal Sout on the basis of the frequency control input FCW. The ADPLL 7 can set the oscillation frequency Fout of the oscillation signal Sout on the basis of the multiplication result of the frequency control input FCW and the oscillation frequency Fref of the oscillation signal Sref.

When the temperature characteristics of the oscillator 3b are tested, a calibrator 8 is connected to the heater unit 2, the oscillators 3a and 3b, and the correction value output unit 5. The calibrator 8 can acquire the correspondence between the oscillation frequencies Fvar and Fref when the temperature of the oscillators 3a and 3b is changed.

At that time, a control voltage VP1 is applied from the calibrator 8 to the heater unit 2 to drive the heater unit 2 and the oscillators 3a and 3b are heated. Then, the calibrator 8 collects the oscillation signals Svar and Sref from the oscillators 3a and 3b and the oscillation signals Svar and Sref are counted. When the correction value output unit 5 is a lookup table, the count value of the oscillation signal Sref corresponding to the count value of the oscillation signal Svar at that time is registered in the correction value output unit 5. When the correction value output unit 5 is an arithmetic unit, the coefficient of the polynomial is calculated from the count value of the oscillation signal Sref corresponding to the count value of the oscillation signal Svar at that time and is then registered in the correction value output unit 5. For example, when Fref=y and Fvar=x are established and the polynomial is $y=ax^3+bx^2+cx+d$, the oscillation signals Svar and Sref can be collected at four or more temperatures and four coefficients a, b, c, and d can be calculated.

When the test for the temperature characteristics of the oscillator 3b ends, the calibrator 8 is disconnected from the heater unit 2, the oscillators 3a and 3b, and the correction value output unit 5. At that time, the driving of the heater unit 2 by the calibrator 8 is stopped and the oscillators 3a and 3b are not heated by the heater unit 2. The oscillation signal Svar output from the oscillator 3a is counted by the counter 4 and the count value is output to the correction value output unit 5. When the correction value output unit 5 is the lookup table, the count value of the oscillation signal Sref corresponding to the count value of the oscillation signal Svar at that time is searched for and is output as the correction value Fh to the frequency control input unit 6. When the correction value output unit 5 is the arithmetic unit, the count value of the oscillation signal Svar at that time is substituted into a variable of the polynomial to calculate the count value of the oscillation signal Sref and the calculated count value is output as the correction value Fh to the frequency control input unit 6.

Then, the frequency control input unit 6 calculates the frequency control input FCW on the basis of the ratio of the oscillation frequency Fout of the oscillation signal Sout of the ADPLL 7 and the correction value Fh and outputs the calculated frequency control input FCW to the ADPLL 7. Then, the ADPLL 7 generates the oscillation signal Sout on the basis of the oscillation signal Sref and controls the oscillation frequency Fout of the oscillation signal Sout so as to be identical to the multiplication result of the frequency control input FCW and the oscillation frequency Fref.

It is possible to reduce the time required to stabilize the temperature of the oscillators 3a and 3b and thus reduce the time required to test the temperature characteristics of the oscillator 3b, as compared to a method in which the heater unit 2 heats the oscillators 3a and 3b to heat the entire semiconductor chip 1.

In addition, since the oscillation frequency Fvar of the oscillator 3a is used as the measured value of the temperature of the oscillator 3b, it is not necessary to use an A/D converter in order to digitize the measured value of the temperature of the oscillator 3b and it is possible to reduce a circuit size.

Figure 2:
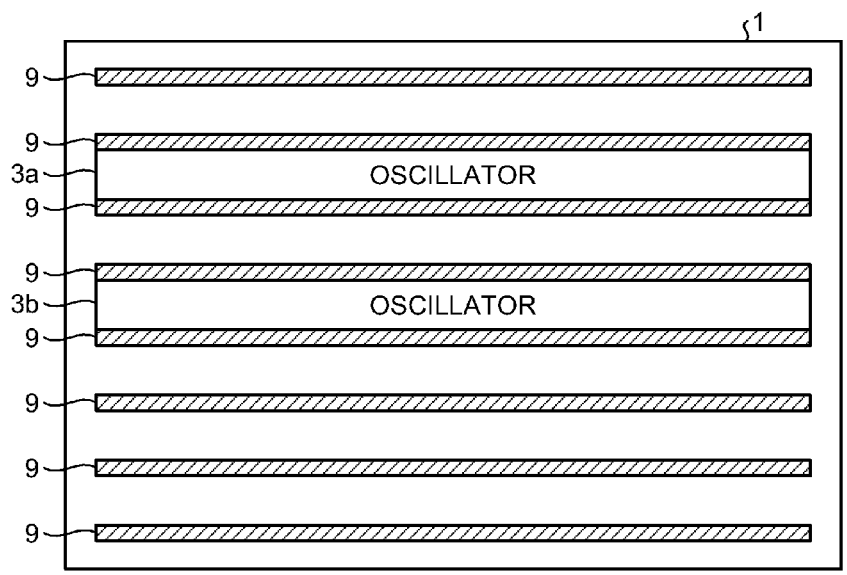
FIG. 2 is a plan view illustrating an example of the layout pattern of a heater unit illustrated in FIG. 1.

FIG. 2 is a plan view illustrating an example of the layout pattern of the heater unit illustrated in FIG. 1.

In FIG. 2, the heater unit 2 is provided with on-chip heaters 9. The on-chip heaters 9 may be arranged around the oscillators 3a and 3b. It is preferable that the oscillators 3a and 3b be arranged adjacent to each other in order to equalize the temperatures of the oscillators 3a and 3b. The on-chip heater 9 may be a resistor which functions as a heating body or a transistor.

Figure 3:
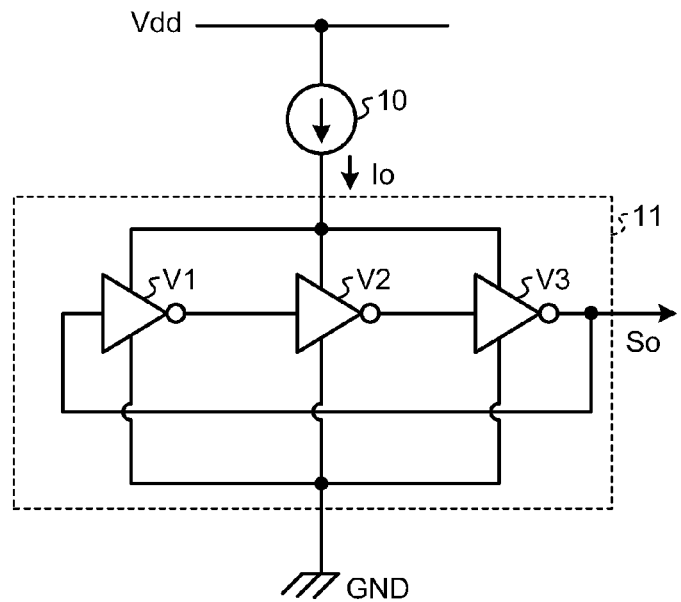
FIG. 3 is a block diagram illustrating the schematic structure of an oscillator illustrated in FIG. 1.

FIG. 3 is a block diagram illustrating the schematic structure of the oscillator illustrated in FIG. 1.

In FIG. 3, the oscillators 3a and 3b are provided with a reference current source 10 and an oscillation circuit 11. It is preferable that a ring oscillation circuit be used as the oscillation circuit 11 in order to reduce the area of the circuit. The reference current source 10 is connected to the oscillation circuit 11 and an output current Io is supplied from the reference current source 10 to the oscillation circuit 11. The oscillation circuit 11 can change the oscillation frequency f of an oscillation signal So on the basis of the output current Io.

The oscillation circuit 11 includes inverters V1 to V3. The inverters V1 to V3 are connected in series to each other and the output from the inverter V3 in the last stage returns to the input of the inverter V1 in the first stage.

In the oscillation circuit 11, the oscillation frequency f depends on the propagation delay time τ of the inverters V1 to V3 and the number of stages N (f∝Nτ). The propagation delay time τ is proportional to the load capacitance C of the inverters V1 to V3 and is inversely proportional to the operation current I and the operation temperature T. Therefore, the oscillation frequency f and the operation temperature T satisfy the relationship f∝IT/C.

Therefore, when the output current Io has PTAT (Proportional to Absolute Temperature) characteristics, it is possible to increase a variation in the oscillation frequency f due to the operation temperature T and the oscillator 3a can have the PTAT characteristics. In addition, when the output current Io has NTAT (Negative to Absolute Temperature) characteristics, it is possible to remove the variation in the oscillation frequency f due to the operation temperature T and the oscillator 3b can have Const characteristics.

Figure 4:
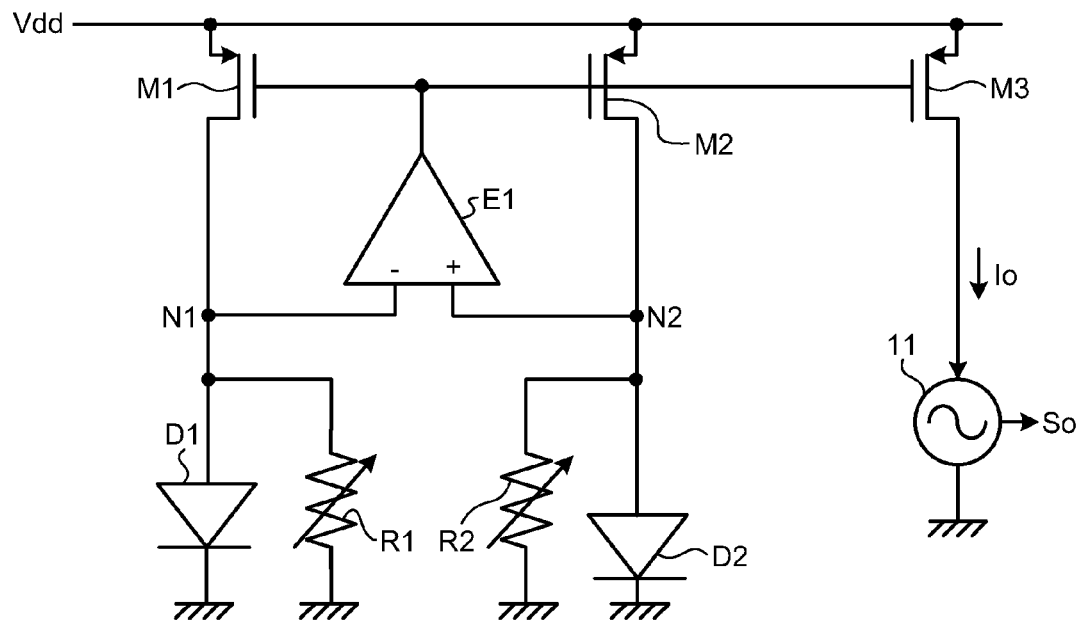
FIG. 4 is a circuit diagram illustrating an example of a reference current source which is used in the oscillator illustrated in FIG. 3.

FIG. 4 is a circuit diagram illustrating an example of the reference current source used in the oscillator illustrated in FIG. 1.

In FIG. 4, the reference current source 10 includes diodes D1 and D2, variable resistors R1 and R2, transistors M1 to M3, and an operational amplifier E1. The diode D1 is connected in parallel to the variable resistor R1 and the diode D2 is connected in parallel to the variable resistor R2. A connection point between the diode D1 and the variable resistor R1 can form a node N1 and a connection point between the diode D2 and the variable resistor R2 can form a node N2. In addition, an inverting input terminal of the operational amplifier E1 is connected to the anode of the diode D1 and a non-inverting input terminal of the operational amplifier E1 is connected to the anode of the diode D2. An output terminal of the operational amplifier E1 is connected to the gates of the transistors M1 to M3 and a power supply potential Vdd is connected to the sources of the transistors M1 to M3.

The drain of the transistor M1 is connected to the inverting input terminal of the operational amplifier E1 and the drain of the transistor M2 is connected to the non-inverting input terminal of the operational amplifier E1. The output current Io is output from the drain of the transistor M3.

The operational amplifier E1 compares the potentials of the nodes N1 and N2. An output voltage V0 from the operational amplifier E1 is controlled such that the potential difference between the nodes N1 and N2 is close to zero and is applied to the gates of the transistors M1 to M3. When the output voltage Vo is applied to the gates of the transistors M1 and M2, a current is supplied to the diode D1 and the variable resistor R1 through the node N1 and is supplied to the diode D2 and the variable resistor R2 through the node N2.

The diodes D1 and D2 have positive temperature characteristics with respect to the current (negative temperature characteristics with respect to the voltage) and the variable resistors R1 and R2 have negative temperature characteristics with respect to the current (positive temperature characteristics with respect to the voltage). Therefore, when the temperature increases, the reference voltage of the diodes D1 and D2 is reduced and a voltage drop due to the variable resistors R1 and R2 increases. The reduction in the reference voltage of the diodes D1 and D2 reduces the potentials of the nodes N1 and N2, and the increase in the voltage drop due to the variable resistors R1 and R2 increases the potentials of the nodes N1 and N2.

When a reduction in the potential of the nodes N1 and N2 caused by the reduction in the reference voltage of the diodes D1 and D2 is more than an increase in the potential of the nodes N1 and N2 caused by the increase in the voltage drop due to the variable resistors R1 and R2, the output current Io increases. On the other hand, when the reduction in the potential of the nodes N1 and N2 caused by the reduction in the reference voltage of the diodes D1 and D2 is less than the increase in the potential of the nodes N1 and N2 caused by the increase in the voltage drop due to the variable resistors R1 and R2, the output current Io is reduced.

Therefore, the values of the variable resistors R1 and R2 can be adjusted to adjust the degree of change in the output current Io due to a temperature variation. Therefore, it is possible to adjust the degree of change in the oscillation frequency f due to the temperature variation.

Figure 5A:
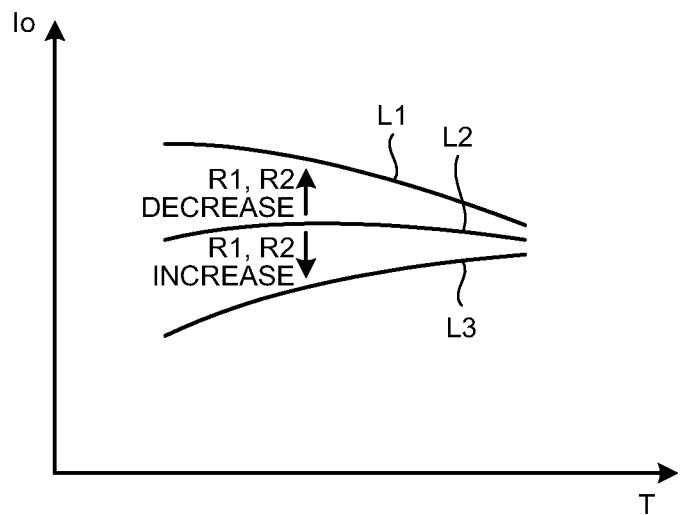
FIG. 5A is a diagram illustrating the relationship between the temperature and an output current when a variable resistance value illustrated in FIG. 4 is changed.
Figure 5B:
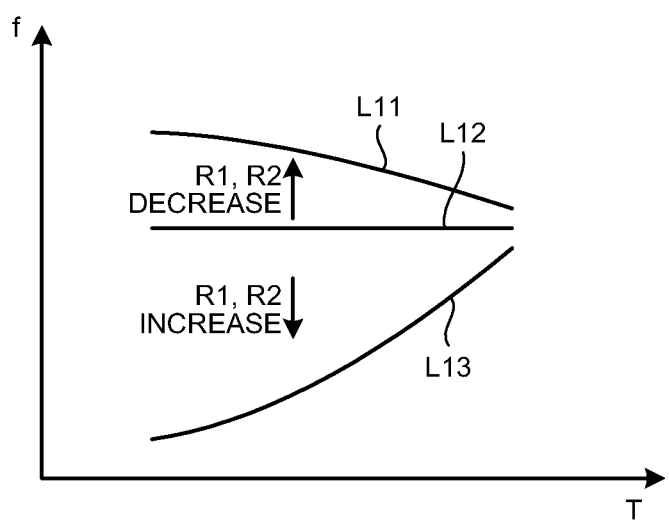
FIG. 5B is a diagram illustrating the relationship between the temperature and an oscillation frequency when the variable resistance value illustrated in FIG. 4 is changed.

FIG. 5A is a diagram illustrating the relationship between the temperature and the output current when the variable resistance value illustrated in FIG. 4 is changed and FIG. 5B is a diagram illustrating the relationship between the temperature and the oscillation frequency when the variable resistance value illustrated in FIG. 4 is changed.

In FIG. 5A, when the values of the variable resistors R1 and R2 increase, the influence of the temperature characteristics of the variable resistors R1 and R2 is less than the influence of the temperature characteristics of the diodes D1 and D2. Therefore, when the temperature increases, the potential of the nodes N1 and N2 is reduced. As a result, the output current Io from the reference current source 10 increases and the reference current source 10 has a PTAT characteristic L3.

When the values of the variable resistors R1 and R2 decrease, the influence of the temperature characteristics of the variable resistors R1 and R2 is more than the influence of the temperature characteristics of the diodes D1 and D2. Therefore, when the temperature increases, the potential of the nodes N1 and N2 increases. As a result, the output current Io from the reference current source 10 decreases and the reference current source 10 has an NTAT characteristic L1.

When the values of the variable resistors R1 and R2 are set such that the influence of the temperature characteristics of the variable resistors R1 and R2 is equal to the influence of the temperature characteristics of the diodes D1 and D2, the potential of the nodes N1 and N2 is maintained to be constant even when the temperature is changed. As a result, the output current Io from the reference current source 10 is maintained to be constant and the reference current source 10 has a Const characteristic L2.

In FIG. 5B, the oscillation circuit 11 illustrated in FIG. 3 has the PTAT characteristic. Therefore, when the output current Io has the Const characteristic L2 or the PTAT characteristic L3, the oscillation circuit 11 can have a PTAT characteristic L13. In addition, when the output current Io has the NTAT characteristic L1, the oscillation circuit 11 can have a Const characteristic L12 or an NTAT characteristic L11.

Figure 6:
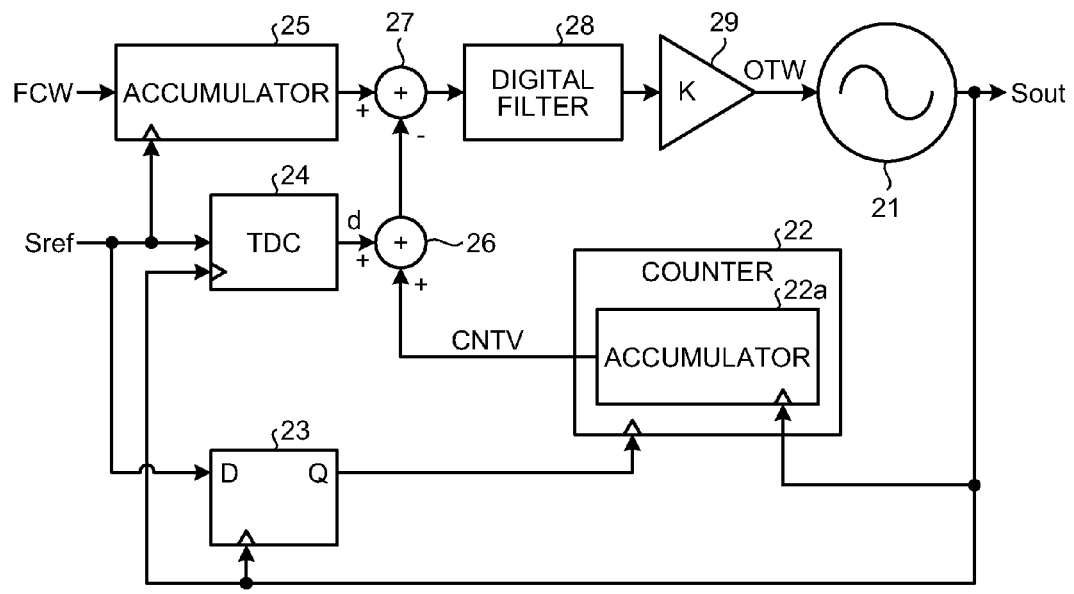
FIG. 6 is a block diagram illustrating the schematic structure of an ADPLL illustrated in FIG. 1.

FIG. 6 is a block diagram illustrating the schematic structure of the ADPLL illustrated in FIG. 1.

In FIG. 6, the ADPLL 7 includes a digitally-controlled oscillator (DCO) 21, a counter 22, an accumulator 25, a flip-flop 23, a time-to-digital converter (TDC) 24, adders 26 and 27, a digital filter 28, and a gain corrector 29. The counter 22 includes an accumulator 22a.

The digitally-controlled oscillator 21 outputs the oscillation signal Sout with the oscillation frequency Fout indicated by an oscillator tuning word OTW input from the gain corrector 29. The flip-flop 23 acquires the oscillation signal Sref input to a data input terminal D in synchronization with the oscillation signal Sout and outputs the synchronized oscillation signal Sref from a data output terminal Q.

The counter 22 integrates the oscillation frequency Fout of the oscillation signal Sout output from the digitally-controlled oscillator 21 using the accumulator 22a and outputs, to the adder 26, an integrated value CNTV of the accumulator 22a when the oscillation signal Sref synchronized with the oscillation signal Sout is input.

The time-to-digital converter 24 acquires values obtained by delaying the oscillation frequency Fout in multiple stages in synchronization with the oscillation signal Sref and generates phase information d that is equal to or less than one cycle of the oscillation signal Sout from the acquired state. Then, the time-to-digital converter 24 outputs the generated phase information d that is equal to or less than one cycle to the adder 26.

The adder 26 adds the integrated value CNTV from the counter 22 and the phase information d that is equal to or less than one cycle and is output from the time-to-digital converter 24 such that the integrated value CNTV is an integer part and the phase information d is a decimal part. The addition result of the adder 26 is input as phase information which is normalized by the oscillation frequency Fref of the oscillation signal Sref to a subtraction input terminal of the adder 27.

The accumulator 25 receives the ratio (Fout/Fh) of the oscillation frequency Fout of the digitally-controlled oscillator 21 to the correction value Fh as the frequency control input FCW. Then, the accumulator 25 integrates the ratio (Fout/Fh) with respect to time, converts the ratio into phase information, and outputs the phase information when the oscillation signal Sref is input as phase control information to an addition input terminal of the adder 27.

The adder 27 subtracts the phase control information obtained from the accumulator 25 from the phase information obtained from the adder 26 to generate phase error information. The digital filter 28 is a loop filter and performs a low-pass filtering process for the phase error information output from the adder 27 to generate a control value for the digitally-controlled oscillator 21. The gain corrector 29 multiplies the control value generated by the digital filter 28 by a coefficient K to generate the control code OTW obtained by correcting a frequency gain for the control value of the digitally-controlled oscillator 21. When the ratio "Fout/Fh" is n, the oscillation frequency of the digitally-controlled oscillator 21 is controlled by the above-mentioned repeated operation such that Fout=n×Fref is established.

Figure 7:
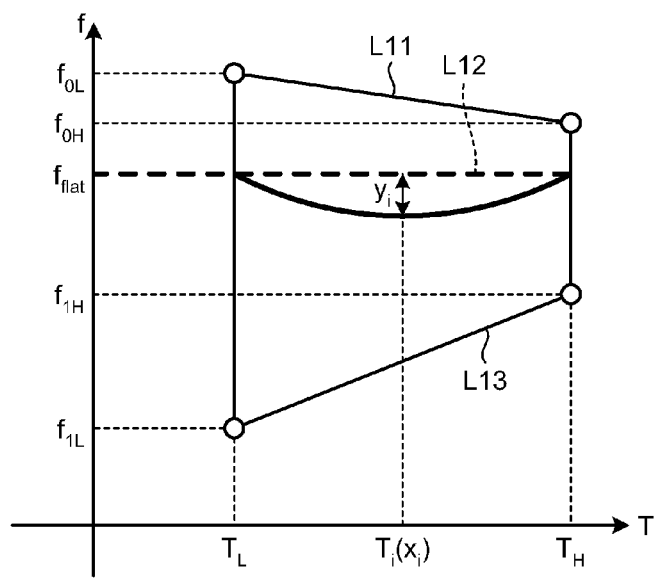
FIG. 7 is a diagram illustrating a method of calculating a correction value when the oscillator illustrated in FIG. 1 has high-order temperature characteristics.

FIG. 7 is a diagram illustrating a method of calculating the correction value when the oscillator illustrated in FIG. 1 has high-order temperature characteristics.

In FIG. 7, as illustrated in FIG. 5A, it is possible to calculate the NTAT characteristic L11 from the oscillation frequencies $f_{OL}$ and $f_{OH}$ of the oscillator 3b at the temperatures $T_L$ and $T_H$ when the values of the variable resistors R1 and R2 illustrated in FIG. 4 increase. In addition, it is possible to calculate the PTAT characteristic L13 from the oscillation frequencies $f_{1L}$ and $f_{1H}$ of the oscillator 3b at the temperatures $T_L$ and $T_H$ when the values of the variable resistors R1 and R2 illustrated in FIG. 4 decrease.

Therefore, the values of the variable resistors R1 and R2 can be adjusted to find an oscillation frequency $f_{flat}$ at which the temperature characteristics of the oscillator 3b are the Const characteristic L12. At the oscillation frequency $f_{flat}$, it is possible to correct the primary temperature characteristics of the oscillator 3b. However, when the oscillator 3b has the second or higher-order temperature characteristics, an error $y_i$ occurs from the Const characteristic L12 at a temperature $T_i(X_i)$. At that time, it is possible to correct the error $y_i$ by setting the correction value Fh to a value obtained by subtracting the error $y_i$ from the oscillation frequency $f_{flat}$.

(Second Embodiment)

FIG. 8 is a block diagram illustrating the schematic structure of an oscillation frequency adjusting circuit according to a second embodiment.

In FIG. 8, the oscillation frequency adjusting circuit includes a PLL control unit 12 and a calibrator 18, instead of the calibrator 8 illustrated in FIG. 1. The PLL control unit 12 generates a control voltage VP2 for driving a heater unit 2 on the basis of the comparison result between the phases of an oscillation signal Svar and a reference signal Pref. In this embodiment, the PLL control unit 12, an oscillator 3a, and the heater unit 2 may form a PLL 13. In addition, the PLL control unit 12 may be provided in a calibrator 18 or it may be formed in a semiconductor chip 1. The calibrator 18 can acquire the correspondence between oscillation frequencies Fvar and Fref when the oscillation frequency of the reference signal Pref is changed.

When the temperature characteristics of the oscillator 3b are tested, the calibrator 18 is connected to the heater unit 2 through the PLL control unit 12 and is also connected to the oscillators 3a and 3b and the correction value output unit 5.

At that time, the calibrator 18 inputs the reference signal Pref to the PLL control unit 12 and also inputs the oscillation signal Fvar to the PLL control unit 12. Then, a control voltage VP2 is generated on the basis of the comparison result between the phases of the oscillation signal Fvar and the reference signal Pref. Then, the control voltage VP2 is applied to the heater unit 2 to drive the heater unit 2 and the oscillators 3a and 3b are heated. The calibrator 18 collects the oscillation signals Svar and Sref from the oscillators 3a and 3b and the oscillation signals Svar and Sref are counted.

When the oscillator 3a has monotonous temperature characteristics, the oscillation frequency Fvar is in one-to-one correspondence with the temperature T. Therefore, when the oscillation frequency Fvar is changed, the temperature T is also changed. The PLL 13 applies the control voltage VP2 to the heater unit 2. Therefore, when the oscillation frequency Frep of the reference signal Pref is changed, the temperature T of the oscillator 3a needs to be changed in order for the oscillation frequency Fvar to follow the oscillation frequency Frep. In order to change the temperature T of the oscillator 3a, it is necessary to change the control voltage VP2 and change the power of the heater unit 2. As a result, the oscillation frequency Frep of the reference signal Pref can be changed to change the temperature T of the oscillators 3a and 3b, and it is possible to obtain the count values of the oscillation signals Svar and Sref when the temperature T of the oscillators 3a and 3b is changed.

FIG. 9 is a block diagram illustrating the schematic structure of the PLL control unit illustrated in FIG. 8.

In FIG. 9, the PLL control unit 12 includes a phase comparator 16, a loop filter 14, and a frequency divider 15. The frequency of the oscillation signal Svar of the oscillator 3a is divided by the frequency divider 15 and the oscillation signal Svar is input to the phase comparator 16. Then, the phase comparator 16 compares the phase of the signal whose frequency is divided by the frequency divider 15 with the phase of the reference signal Pref and outputs a signal corresponding to the phase difference to the loop filter 14. An unnecessary frequency component is reduced from the output of the phase comparator 16 to generate the control voltage VP2 and the control voltage VP2 is input to the heater unit 2.

Figure 10:
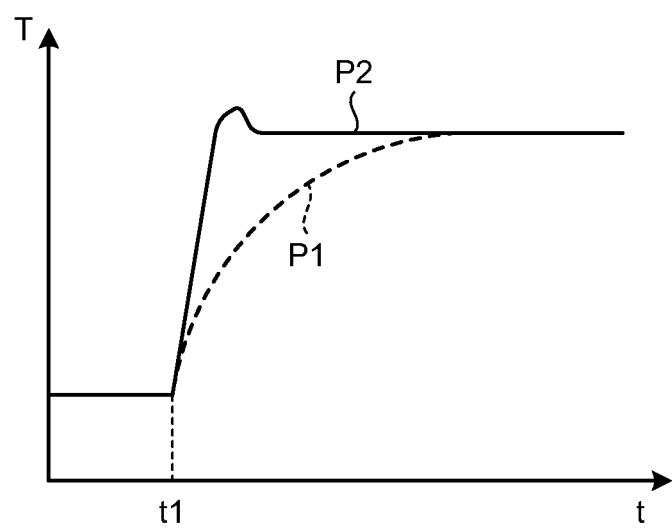
FIG. 10 is a diagram illustrating comparison between the convergence of the temperature of the oscillation frequency adjusting circuit illustrated in FIG. 8 and the convergence of the temperature of the oscillation frequency adjusting circuit illustrated in FIG. 1.

FIG. 10 is a diagram illustrating the comparison between the convergence of the temperature of the oscillation frequency adjusting circuit illustrated in FIG. 8 and the convergence of the temperature of the oscillation frequency adjusting circuit illustrated in FIG. 1. In FIG. 10, P1 indicates a variation in the temperature of the oscillators 3a and 3b when the oscillators 3a and 3b are heated by the heater unit 2 illustrated in FIGS. 1 and P2 indicates a variation in the temperature of the oscillators 3a and 3b when the oscillators 3a and 3b are heated by the heater unit 2 illustrated in FIG. 8.

In FIG. 10, in the oscillation frequency adjusting circuit illustrated in FIG. 8, the control voltage VP2 of the heater unit 2 is controlled by the PLL 13 such that the phases of the oscillation signal Svar and the reference signal Pref are identical to each other. Therefore, in the oscillation frequency adjusting circuit illustrated in FIG. 8, it is possible to improve the convergence of the temperature and reduce the time required to test the temperature characteristics of the oscillator 3b, as compared to the oscillation frequency adjusting circuit illustrated in FIG. 1.

(Third Embodiment)

Figure 11:
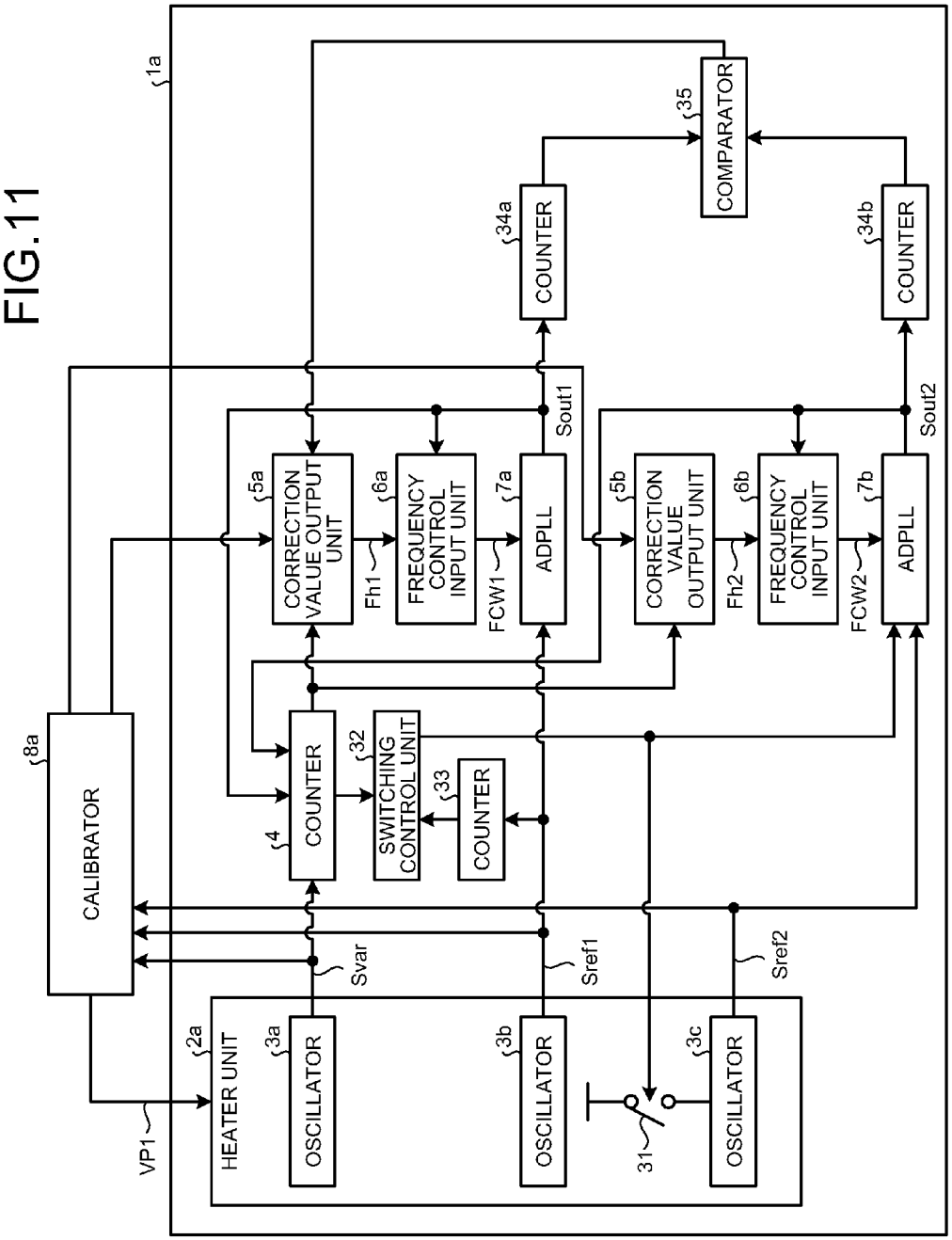
FIG. 11 is a block diagram illustrating the schematic structure of an oscillation frequency adjusting circuit according to a third embodiment.

FIG. 11 is a block diagram illustrating the schematic structure of an oscillation frequency adjusting circuit according to a third embodiment.

In FIG. 11, the oscillation frequency adjusting circuit includes a heater unit 2a, oscillators 3a to 3c, counters 4, 33, 34a, and 34b, correction value output units 5a and 5b, frequency control input units 6a and 6b, ADPLLs 7a and 7b, a switching unit 31, a switching control unit 32, and a comparison unit 35. The heater unit 2a, the oscillators 3a to 3c, the counters 4, 33, 34a, and 34b, the correction value output units 5a and 5b, the frequency control input units 6a and 6b, the ADPLLs 7a and 7b, the switching unit 31, the switching control unit 32, and the comparison unit 35 can be formed in a semiconductor chip 1a.

The oscillator 3a outputs an oscillation signal Svar. The oscillation frequency Fvar of the oscillator 3a can be changed depending on the temperature. For example, the oscillation frequency Fvar of the oscillator 3a may be monotonously changed depending on the temperature. The oscillators 3b and 3c output oscillation signals Sref1 and Sref2, respectively. The oscillation frequencies Fref1 and Fref2 of the oscillators 3b and 3c can be changed depending on the temperature. For example, a change in the oscillation frequencies Fref1 and Fref2 of the oscillators 3b and 3c depending on the temperature may be less than a change in the oscillation frequency of the oscillator 3a, or the oscillation frequencies Fref1 and Fref2 may not be changed depending on the temperature.

The heater unit 2a can heat the oscillators 3a to 3c at the same time. The heater unit 2a and the oscillators 3a to 3c may be arranged such that the temperatures of the oscillators 3a to 3c are equal to each other during heating.

The counter 4 counts the oscillation signal Svar. For example, the counter 4 can increase the count value whenever the rising edge of the oscillation signal Svar is detected.

The correction value output unit 5a outputs a correction value Fh1. The correction value Fh1 is used to correct the temperature characteristics of the oscillator 3b on the basis of the count value of the counter 4 and is also used to correct the deterioration of the oscillator 3b over time on the basis of the comparison result of the comparison unit 35. In the correction of the deterioration of the oscillator 3b over time, the oscillation frequency of the oscillator 3b can be corrected on the basis of the oscillation frequency of the oscillator 3c.

The frequency control input unit 6a generates a frequency control input FCW1 to the ADPLL 7a on the basis of a correction value Fh1. The frequency control input FCW1 may be the ratio of the oscillation frequency Fout1 of an oscillation signal Sout1 of the ADPLL 7a to the correction value Fh1.

The ADPLL 7a generates the oscillation signal Sout1 on the basis of the oscillation signal Sref1 of the oscillator 3b and corrects the oscillation frequency Fout1 of the oscillation signal Sout1 on the basis of the frequency control input FCW1. The ADPLL 7a can set the oscillation frequency Fout1 of the oscillation signal Sout1 on the basis of the multiplication result of the frequency control input FCW1 and the oscillation frequency Fref1 of the oscillation signal Sref1.

The correction value output unit 5b outputs a correction value Fh2. The correction value Fh2 can be used to correct the temperature characteristics of the oscillator 3c on the basis of the count value of the counter 4.

The frequency control input unit 6b generates a frequency control input FCW2 to the ADPLL 7b on the basis of the correction value Fh2. The frequency control input FCW2 may be the ratio of the oscillation frequency Fout2 of an oscillation signal Sout2 of the ADPLL 7b to the correction value Fh2.

The ADPLL 7b generates the oscillation signal Sout2 on the basis of the oscillation signal Sref2 of the oscillator 3c and corrects the oscillation frequency Fout2 of the oscillation signal Sout2 on the basis of the frequency control input FCW2. The ADPLL 7b can set the oscillation frequency Fout2 of the oscillation signal Sout2 on the basis of the multiplication result of the frequency control input FCW2 and the oscillation frequency Fref2 of the oscillation signal Sref2.

The switching unit 31 switches the operation of the oscillator 3c. That is, the switching unit 31 can turn off the power of the oscillator 3c to stop the oscillator 3c or can turn on the power of the oscillator 3c to operate the oscillator 3c.

The switching control unit 32 controls the switching unit 31 such that the oscillator 3c is changed from a stopped state to an operating state when a predetermined condition is satisfied. Examples of the predetermined condition include a case in which the oscillator 3b operates only for a predetermined period of time.

The counter 33 counts the oscillation signal Sref1. For example, the counter 33 can increase the count value whenever the rising edge of the oscillation signal Sref1 is detected. The counter 34a counts the oscillation signal Sout1. For example, the counter 34a can increase the count value whenever the rising edge of the oscillation signal Sout1 is detected. The counter 34b counts the oscillation signal Sout2. For example, the counter 34b can increase the count value whenever the rising edge of the oscillation signal Sout2 is detected. The comparison unit 35 compares the count value of the counter 34a with the count value of the counter 34b and outputs the comparison result to the correction value output unit 5a.

When the temperature characteristics of the oscillators 3b and 3c are tested, a calibrator 8a is connected to the heater unit 2a, the oscillators 3a to 3c, and the correction value output units 5a and 5b. The calibrator 8a can acquire the correspondence between the oscillation frequencies Fvar and Fref1 and the correspondence between the oscillation frequencies Fvar and Fref2 when the temperature of the oscillators 3a to 3c is changed.

At that time, the calibrator 8a inputs a control voltage VP1 to the heater unit 2a to drive the heater unit 2a, and the oscillators 3a to 3c are heated. Then, the calibrator 8a collects the oscillation signals Svar, Sref1, and Sref2 from the oscillators 3a to 3c and the oscillation signals Svar, Sref1, and Sref2 are counted. When the correction value output units 5a and 5b are lookup tables, the count value of the oscillation signal Sref1 corresponding to the count value of the oscillation signal Svar at that time is registered in the correction value output unit 5a, and the count value of the oscillation signal Sref2 corresponding to the count value of the oscillation signal Svar at that time is registered in the correction value output unit 5b. When the correction value output units 5a and 5b are arithmetic units, the coefficient of a polynomial is calculated from the count value of the oscillation signal Sref1 corresponding to the count value of the oscillation signal Svar at that time and is then registered in the correction value output unit 5a. In addition, the coefficient of the polynomial is calculated from the count value of the oscillation signal Sref2 corresponding to the count value of the oscillation signal Svar at that time and is then registered in the correction value output unit 5b.

Then, when the test for the temperature characteristics of the oscillators 3b and 3c ends, the calibrator 8a is disconnected from the heater unit 2a, the oscillators 3a to 3c, and the correction value output units 5a and 5b. At that time, the driving of the heater unit 2a by the calibrator 8a is stopped and the oscillators 3a to 3c are not heated by the heater unit 2a.

The switching control unit 32 refers to the count value of the counter 33. When the count value of the counter 33 is equal to or less than a predetermined value, the power of the oscillator 3c and the ADPLL 7b is turned off and the oscillator 3c and the ADPLL 7b are stopped.

The counter 4 counts the oscillation signal Svar output from the oscillator 3a and outputs the count value to the correction value output unit 5a. When the correction value output unit 5a is a lookup table, the count value of the oscillation signal Sref1 corresponding to the count value of the oscillation signal Svar at that time is searched for and is then output as the correction value Fh1 to the frequency control input unit 6a. When the correction value output unit 5a is an arithmetic unit, the count value of the oscillation signal Svar at that time is substituted into a variable of the polynomial to calculate the count value of the oscillation signal Sref1 and the calculated count value is output as the correction value Fh1 to the frequency control input unit 6a.

The frequency control input unit 6a calculates the frequency control input FCW1 on the basis of the ratio of the oscillation frequency Fout1 of the oscillation signal Sout1 of the ADPLL 7a to the correction value Fh1 and outputs the calculation result to the ADPLL 7a. Then, the ADPLL 7a generates the oscillation signal Sout1 on the basis of the oscillation signal Sref1 and controls the oscillation frequency Fout1 of the oscillation signal Sout1 so as to be identical to the multiplication result of the frequency control input FCW1 and the oscillation frequency Fref1.

When the oscillator 3b outputs the oscillation signal Sref1, the counter 33 counts the oscillation signal Sref1. When the count value of the counter 33 is greater than a predetermined value, the power of the oscillator 3c and the ADPLL 7b is turned on and the oscillator 3c and the ADPLL 7b operate.

The counter 4 counts the oscillation signal Svar output from the oscillator 3a and outputs the count value to the correction value output unit 5b. When the correction value output unit 5b is a lookup table, the count value of the oscillation signal Sref2 corresponding to the count value of the oscillation signal Svar at that time is searched for and is then output as the correction value Fh2 to the frequency control input unit 6b. When the correction value output unit 5b is an arithmetic unit, the count value of the oscillation signal Svar at that time is substituted into the variable of the polynomial to calculate the count value of the oscillation signal Sref2 and the calculated count value is output as the correction value Fh2 to the frequency control input unit 6b.

Then, the frequency control input unit 6b calculates the frequency control input FCW2 on the basis of the ratio of the oscillation frequency Fout2 of the oscillation signal Sout2 of the ADPLL 7b to the correction value Fh2 and outputs the calculation result to the ADPLL 7b. Then, the ADPLL 7b generates the oscillation signal Sout2 on the basis of the oscillation signal Sref2 and controls the oscillation frequency Fout2 of the oscillation signal Sout2 so as to be identical to the multiplication result of the frequency control input FCW2 and the oscillation frequency Fref2.

The counters 34a and 34b count the oscillation signals Sout1 and Sout2 output from the ADPLLs 7a and 7b, respectively, and output the count values to the comparison unit 35. Then, the comparison unit 35 compares the count value of the counter 34a with the count value of the counter 34b and outputs the comparison result to the correction value output unit 5a. Then, the correction value output unit 5a corrects the correction value Fh1 such that the count value of the counter 34a is equal to the count value of the counter 34b. At that time, when the correction value output unit 5 is a lookup table, the correction value Fh1 may be corrected for each count value of the counter 4. When the correction value output unit 5 is an arithmetic unit, the coefficient of the polynomial which describes the second or higher-order temperature characteristics of the oscillator 3b may be corrected.

When the correction value Fh1 of the oscillator 3b is corrected on the basis of the operation of the oscillator 3c, the counter 33 is cleared. In addition, the power of the oscillator 3c and the ADPLL 7b is turned off and the oscillator 3c and the ADPLL 7b are stopped.

The oscillator 3c can be intermittently operated to prevent deterioration over time, as compared to the oscillator 3b. Therefore, it is possible to reduce a variation in the frequency of the oscillator 3b by correcting the deterioration of the oscillator 3b over time on the basis of the operation of the oscillator 3c.

(Fourth Embodiment)

Figure 12:
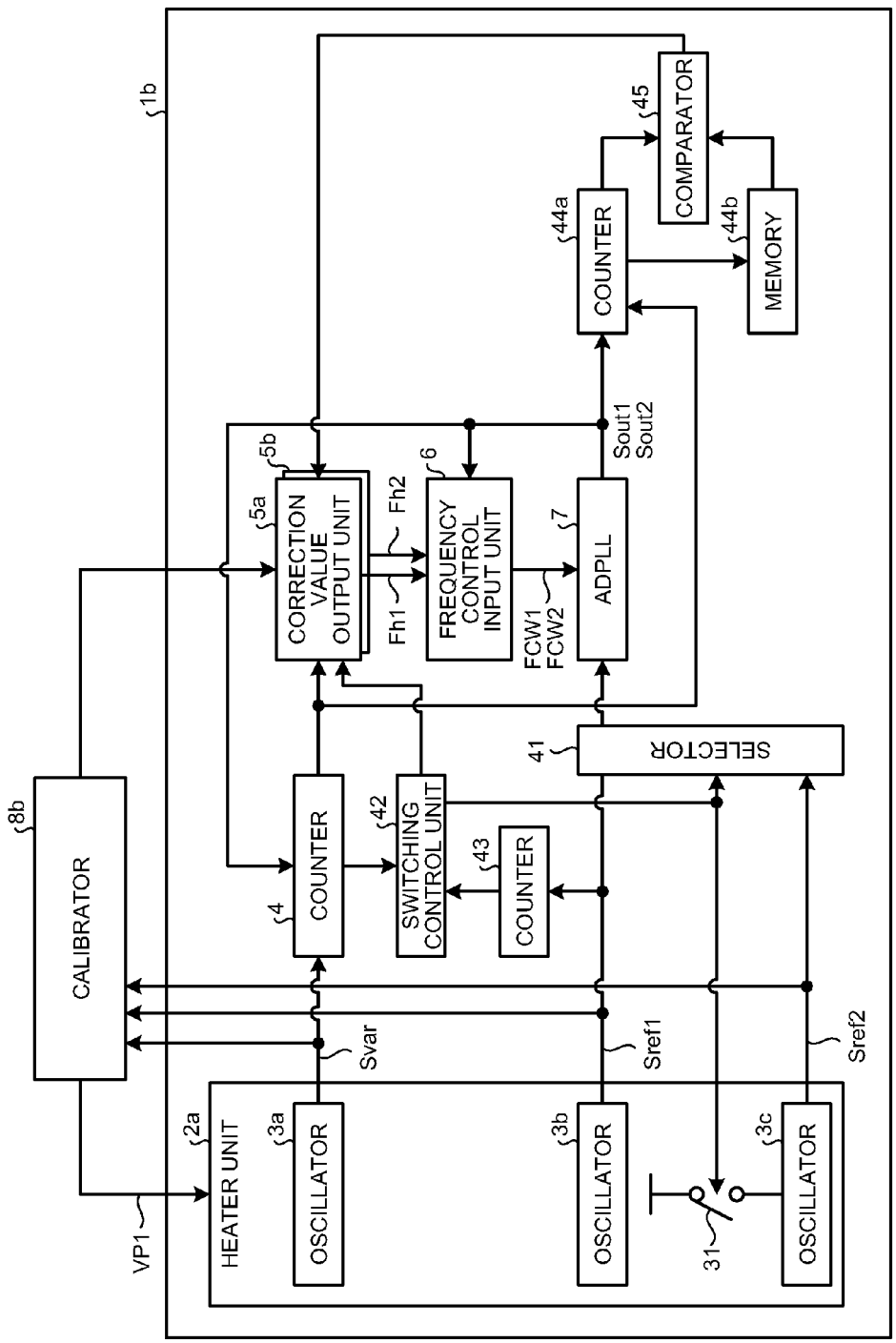
FIG. 12 is a block diagram illustrating the schematic structure of an oscillation frequency adjusting circuit according to a fourth embodiment.

FIG. 12 is a block diagram illustrating the schematic structure of an oscillation frequency adjusting circuit according to a fourth embodiment.

In FIG. 12, the oscillation frequency adjusting circuit includes a switching control unit 42, a selector 41, counters 43 and 44a, a memory 44b, and a comparison unit 45, instead of the switching control unit 32, the frequency control input unit 6b, the ADPLL 7b, the counters 33, 34a, and 34b, and the comparison unit 35 illustrated in FIG. 11.

A correction value output unit 5a outputs a correction value Fh1. The correction value Fh1 is used to correct the temperature characteristics of an oscillator 3b on the basis of the count value of a counter 4 and is also used to correct the deterioration of the oscillator 3b over time on the bass of the comparison result of the comparison unit 45. In the correction of the deterioration of the oscillator 3b over time, it is possible to correct the oscillation frequency of the oscillator 3b on the basis of the oscillation frequency of an oscillator 3c.

A correction value output unit 5b outputs a correction value Fh2. The correction value Fh2 can be used to correct the temperature characteristics of an oscillator 3c on the basis of the count value of the counter 4.

A frequency control input unit 6 generates a frequency control input FCW1 to an ADPLL 7 on the basis of the correction value Fh1 and generates a frequency control input FCW2 to the ADPLL 7 on the basis of the correction value Fh2.

When the selector 41 selects an oscillation signal Sref1 of the oscillator 3b, the ADPLL 7 generates an oscillation signal Sout1 on the basis of the oscillation signal Sref1 of the oscillator 3b and corrects the oscillation frequency Fout1 of the oscillation signal Sout1 on the basis of the frequency control input FCW1. When the selector 41 selects an oscillation signal Sref2 of the oscillator 3c, the ADPLL 7 generates an oscillation signal Sout2 on the basis of the oscillation signal Sref2 of the oscillator 3c and corrects the oscillation frequency Fout2 of the oscillation signal Sout2 on the basis of the frequency control input FCW2.

The selector 41 selects the oscillation signal Sref1 of the oscillator 3b or the oscillation signal Sref2 of the oscillator 3c and outputs the selected oscillation signal to the ADPLL 7. The switching control unit 42 controls the switching unit 31 such that the oscillator 3c is changed from a stopped state to an operating state when a predetermined condition is satisfied. In addition, the switching control unit 42 switches the correction value output units 5a and 5b according to the selection result of the selector 41.

The counter 43 counts the oscillation signal Sref1. For example, the counter 43 can increase the count value whenever the rising edge of the oscillation signal Sref1 is detected. The counter 44a counts the oscillation signals Sout1 and Sout2. For example, the counter 44a can increase the count value whenever the rising edges of the oscillation signals Sout1 and Sout2 are detected. The memory 44b stores the count value of the counter 44a. The comparison unit 45 compares the count value of the counter 44a with the count value of the counter 44b and outputs the comparison result to the correction value output unit 5a.

When the temperature characteristics of the oscillators 3b and 3c are tested, a calibrator 8b is connected to the heater unit 2a, the oscillators 3a to 3c, and the correction value output units 5a and 5b. The calibrator 8b can acquire the correspondence between the oscillation frequencies Fvar and Fref1 and the correspondence between the oscillation frequencies Fvar and Fref2 when the temperature of the oscillators 3a to 3c is changed.

At that time, the calibrator 8b inputs a control voltage VP1 to the heater unit 2a to drive the heater unit 2a and the oscillators 3a to 3c are heated. Then, the calibrator 8a collects the oscillation signals Svar, Sref1, and Sref2 from the oscillators 3a to 3c and the oscillation signals Svar, Sref1, and Sref2 are counted. When the correction value output units 5a and 5b are lookup tables, the count value of the oscillation signal Sref1 corresponding to the count value of the oscillation signal Svar at that time is registered in the correction value output unit 5a, and the count value of the oscillation signal Sref2 corresponding to the count value of the oscillation signal Svar at that time is registered in the correction value output unit 5b. When the correction value output units 5a and 5b are arithmetic units, the coefficient of a polynomial is calculated from the count value of the oscillation signal Sref1 corresponding to the count value of the oscillation signal Svar at that time and is then registered in the correction value output unit 5a. In addition, the coefficient of the polynomial is calculated from the count value of the oscillation signal Sref2 corresponding to the count value of the oscillation signal Svar at that time and is then registered in the correction value output unit 5b.

Then, when the test for the temperature characteristics of the oscillators 3b and 3c ends, the calibrator 8b is disconnected from the heater unit 2a, the oscillators 3a to 3c, and the correction value output units 5a and 5b. At that time, the driving of the heater unit 2a by the calibrator 8b is stopped and the oscillators 3a to 3c are not heated by the heater unit 2a.

The switching control unit 42 refers to the count value of the counter 43. When the count value of the counter 43 is equal to or less than a predetermined value, the power of the oscillator 3c is turned off and the oscillator 3c is stopped. The selector 41 selects the oscillation signal Svar1 of the oscillator 3a and outputs the selected oscillation signal Svar to the ADPLL 7.

The counter 4 counts the oscillation signal Svar output from the oscillator 3a and outputs the count value to the correction value output unit 5a. When the correction value output unit 5a is a lookup table, the count value of the oscillation signal Sref1 corresponding to the count value of the oscillation signal Svar at that time is searched for and is then output as the correction value Fh1 to the frequency control input unit 6a. When the correction value output unit 5a is an arithmetic unit, the count value of the oscillation signal Svar at that time is substituted into a variable of the polynomial to calculate the count value of the oscillation signal Sref1 and the calculated count value is output as the correction value Fh1 to the frequency control input unit 6a.

The frequency control input unit 6a calculates the frequency control input FCW1 on the basis of the ratio of the oscillation frequency Fout1 of the oscillation signal Sout1 of the ADPLL 7 to the correction value Fh1 and outputs the calculation result to the ADPLL 7. Then, the ADPLL 7 generates the oscillation signal Sout1 on the basis of the oscillation signal Sref1 and controls the oscillation frequency Fout1 of the oscillation signal Sout1 so as to be identical to the multiplication result of the frequency control input FCW1 and the oscillation frequency Fref1. At that time, when the ADPLL 7 outputs the oscillation signal Sout1, the counter 44a counts the oscillation signal Sout1.

When the oscillator 3b outputs the oscillation signal Sref1, the counter 43 counts the oscillation signal Sref1. When the count value of the counter 43 is greater than a predetermined value, the power of the oscillator 3c is turned on and the oscillator 3c operates. The count value of the counter 44a is stored in the memory 44b. The selector 41 selects the oscillation signal Sref2 of the oscillator 3c and outputs the oscillation signal Sref2 to the ADPLL 7.

The counter 4 counts the oscillation signal Svar output from the oscillator 3a and outputs the count value to the correction value output unit 5b. When the correction value output unit 5b is a lookup table, the count value of the oscillation signal Sref2 corresponding to the count value of the oscillation signal Svar at that time is searched for and is then output as the correction value Fh2 to the frequency control input unit 6. When the correction value output unit 5b is an arithmetic unit, the count value of the oscillation signal Svar at that time is substituted into the variable of the polynomial to calculate the count value of the oscillation signal Sref2 and the calculated count value is output as the correction value Fh2 to the frequency control input unit 6.

Then, the frequency control input unit 6 calculates the frequency control input FCW2 on the basis of the ratio of the oscillation frequency Fout2 of the oscillation signal Sout2 of the ADPLL 7 to the correction value Fh2 and outputs the calculation result to the ADPLL 7. Then, the ADPLL 7 generates the oscillation signal Sout2 on the basis of the oscillation signal Sref2 and controls the oscillation frequency Fout2 of the oscillation signal Sout2 so as to be identical to the multiplication result of the frequency control input FCW2 and the oscillation frequency Fref2. At that time, when the ADPLL 7 outputs the oscillation signal Sout2, the counter 44a counts the oscillation signal Sout2. Then, the comparison unit 45 compares the count value of the counter 44a with the count value stored in the memory 44b and outputs the comparison result to the correction value output unit 5a. Then, the correction value output unit 5a corrects the correction value Fh1 such that the count value stored in the memory 44b is identical to the count value of the counter 44a.

When the correction value Fh1 of the oscillator 3b is corrected on the basis of the operation of the oscillator 3c, the counter 43 is cleared. In addition, the power of the oscillator 3c is turned off and the oscillator 3c is stopped.

The oscillator 3c can be intermittently operated to prevent deterioration over time, as compared to the oscillator 3b. Therefore, it is possible to reduce a variation in the frequency of the oscillator 3b by correcting the deterioration of the oscillator 3b over time on the basis of the operation of the oscillator 3c. In addition, since the selector 41 selects the outputs of the oscillators 3b and 3c, the ADPLL 7 can be shared by the oscillators 3b and 3c and it is possible to reduce a circuit size.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An oscillation frequency adjusting circuit comprising:
   a first oscillator with an oscillation frequency that is changed depending on a temperature;
   a second oscillator that has different temperature characteristics from the first oscillator;
   an on-chip heater that heats the first oscillator and the second oscillator;
   a counter that counts a first oscillation signal of the first oscillator; and an ADPLL that generates a third oscillation signal on the basis of a second oscillation signal of the second oscillator and corrects a frequency of the third oscillation signal on the basis of a count value of the counter.

2. The oscillation frequency adjusting circuit according to claim 1, further comprising:
a correction value output unit that outputs a correction value for correcting the temperature characteristics of the second oscillator on the basis of the count value of the counter; and
a frequency control input unit that generates a frequency control input to the ADPLL on the basis of the correction value.

3. The oscillation frequency adjusting circuit according to claim 2,
wherein the frequency control input is a ratio of an oscillation frequency of the third oscillation signal to the correction value.

4. The oscillation frequency adjusting circuit according to claim 3,
wherein the ADPLL sets the oscillation frequency of the third oscillation signal on the basis of a multiplication result of the frequency control input and the oscillation frequency of the second oscillation signal.

5. The oscillation frequency adjusting circuit according to claim 2,
wherein the correction value output unit outputs a correction value for correcting the second or higher-order temperature characteristics of the second oscillator on the basis of the count value of the counter.

6. The oscillation frequency adjusting circuit according to claim 5,
wherein the correction value output unit includes a lookup table in which a correspondence between the count value of the counter and the correction value is registered.

7. The oscillation frequency adjusting circuit according to claim 5,
wherein the correction value output unit includes an arithmetic unit that calculates the correction value on the basis of a polynomial which describes the second or higher-order temperature characteristics of the second oscillator.

8. The oscillation frequency adjusting circuit according to claim 1,
wherein the first oscillator and the second oscillator are ring oscillators.

9. The oscillation frequency adjusting circuit according to claim 1,
wherein the oscillation frequency of the first oscillator is monotonously changed depending on the temperature, and
a change in the oscillation frequency of the second oscillator depending on the temperature is less than a change in the oscillation frequency of the first oscillator.

10. The oscillation frequency adjusting circuit according to claim 9,
wherein the oscillation frequency of the second oscillator is not changed depending on the temperature.

11. The oscillation frequency adjusting circuit according to claim 1,
wherein the temperature characteristics of the first oscillator are changed due to a change in the temperature characteristics of a first reference current source of the first oscillator, and
the temperature characteristics of the second oscillator are changed due to a change in the temperature characteristics of a second reference current source of the second oscillator.

12. The oscillation frequency adjusting circuit according to claim 1,
wherein the first oscillator, the second oscillator, and the on-chip heater are provided in the same semiconductor chip.

13. The oscillation frequency adjusting circuit according to claim 1, further comprising:
a PLL control unit that generates a control voltage for driving the on-chip heater on the basis of a comparison result between the phases of the first oscillation signal and a reference signal.

14. The oscillation frequency adjusting circuit according to claim 13,
wherein the PLL control unit, the first oscillator, and the on-chip heater form a PLL.

15. The oscillation frequency adjusting circuit according to claim 14,
wherein the PLL control unit includes:
a frequency divider that divides the frequency of the first oscillation signal;
a phase comparator that compares the phase of an output from the frequency divider with the phase of the reference signal; and
a loop filter that reduces an unnecessary frequency component from an output from the phase comparator and outputs the control voltage.

16. The oscillation frequency adjusting circuit according to claim 1, further comprising:
a calibrator that collects the first oscillation signal and the second oscillation signal while driving the on-chip heater when the temperature characteristics of the second oscillator are tested and calculates a count value of the first oscillation signal and a count value of the second oscillation signal.

17. The oscillation frequency adjusting circuit according to claim 11, further comprising:
a calibrator that collects the first oscillation signal and the second oscillation signal while outputting the reference signal to the PLL control unit when the temperature characteristics of the second oscillator are tested and calculates a count value of the first oscillation signal and a count value of the second oscillation signal.

18. The oscillation frequency adjusting circuit according to claim 17,
wherein the count value of the first oscillation signal corresponds to the temperature and the temperature characteristics of the second oscillator are calculated from the count value of the second oscillation signal.

19. An oscillation frequency adjusting circuit comprising:
a first oscillator with an oscillation frequency that is changed depending on a temperature;
a second oscillator that has different temperature characteristics from the first oscillator;
a third oscillator that has different temperature characteristics from the first oscillator;
an on-chip heater that heats the first oscillator, the second oscillator, and the third oscillator;
a switching unit that switches an operation of the third oscillator;
a counter that counts a first oscillation signal of the first oscillator;
a first ADPLL that generates a fourth oscillation signal on the basis of a second oscillation signal of the second oscillator and corrects a frequency of the fourth oscillation signal on the basis of a count value of the counter; and a second ADPLL that generates a fifth oscillation signal on the basis of a third oscillation signal of the third oscillator and corrects a frequency of the fifth oscillation signal on the basis of the count value of the counter, wherein the first ADPLL corrects an oscillation frequency of the fifth oscillation signal on the basis of an oscillation frequency of the fourth oscillation signal.

20. An oscillation frequency adjusting circuit comprising:

a first oscillator with an oscillation frequency that is changed depending on a temperature;

a second oscillator that has different temperature characteristics from the first oscillator;

a third oscillator that has different temperature characteristics from the first oscillator;

an on-chip heater that heats the first oscillator, the second oscillator, and the third oscillator;

a switching unit that switches an operation of the third oscillator;

a counter that counts a first oscillation signal of the first oscillator;

a selector that selects a second oscillation signal of the second oscillator or a third oscillation signal of the third oscillator; and an ADPLL, wherein, when the selector selects the second oscillation signal, the ADPLL generates a fourth oscillation signal on the basis of the second oscillation signal and corrects a frequency of the fourth oscillation signal on the basis of a count value of the counter, when the selector selects the third oscillation signal, the ADPLL generates a fifth oscillation signal on the basis of the third oscillation signal and corrects a frequency of the fifth oscillation signal on the basis of the count value of the counter, and the first ADPLL corrects an oscillation frequency of the fifth oscillation signal on the basis of an oscillation frequency of the fourth oscillation signal.

\* \* \* \* \*